United States Patent [19]
Yang et al.

[11] Patent Number: 4,857,973
[45] Date of Patent: Aug. 15, 1989

[54] SILICON WAVEGUIDE WITH MONOLITHICALLY INTEGRATED SCHOTTKY BARRIER PHOTODETECTOR

[75] Inventors: Andrew C. Yang, Concord; Joseph P. Lorenzo, Stow; Richard A. Soref, Newton Centre, all of Mass.

[73] Assignee: The United States of America as represented by the Secretary of the Air Force, Washington, D.C.

[21] Appl. No.: 49,352

[22] Filed: May 14, 1987

[51] Int. Cl.$^4$ .................. H01L 29/48; H01L 27/14
[52] U.S. Cl. ........................ 357/15; 357/30; 333/103; 333/157; 333/164
[58] Field of Search ............ 357/15, 30 C, 30 K, 357/30 L, 30 Q, 30 R; 333/103, 157, 164

[56] References Cited

U.S. PATENT DOCUMENTS

| Re. 29,578 | 3/1978 | Javan | 250/211 J |
|---|---|---|---|
| 4,244,750 | 1/1981 | Chenevas-Paule et al. | 357/15 |
| 4,322,695 | 3/1985 | Fleming et al. | 357/15 |
| 4,394,571 | 7/1983 | Jurisson | 250/216 |
| 4,398,344 | 8/1983 | Gould | 29/590 |
| 4,467,340 | 8/1984 | Rode et al. | 357/24 |
| 4,485,389 | 11/1984 | Ovshinsky et al. | 357/30 K |
| 4,496,964 | 1/1985 | Tsubouchi et al. | 357/30 |
| 4,531,055 | 7/1985 | Shepherd, Jr. et al. | 250/211 J |
| 4,533,933 | 8/1985 | Pellegrini et al. | 357/15 |
| 4,543,442 | 9/1985 | Alcorn et al. | 357/15 |
| 4,568,897 | 2/1986 | Stern et al. | 357/15 |

FOREIGN PATENT DOCUMENTS

| 55-22812 | 2/1980 | Japan | 357/15 LA |
|---|---|---|---|
| 55-22813 | 2/1980 | Japan | 357/15 |
| 60-210884 | 10/1985 | Japan | 357/30 K |

*Primary Examiner*—Andrew J. James
*Assistant Examiner*—Ngan Van Ngo
*Attorney, Agent, or Firm*—Jules Jay Morris; Donald J. Singer

[57] ABSTRACT

The invention comprises a Schottky barrier type infrared photodetector which is monolithically integrated on a silicon waveguide. A Schottky barrier contact is positioned directly on a silicon waveguide to absorb grazing incidence optical signals passing through the waveguide. The Schottky contact is operated in the avalanche or reverse bias mode to generate a useable electrical signal.

3 Claims, 3 Drawing Sheets

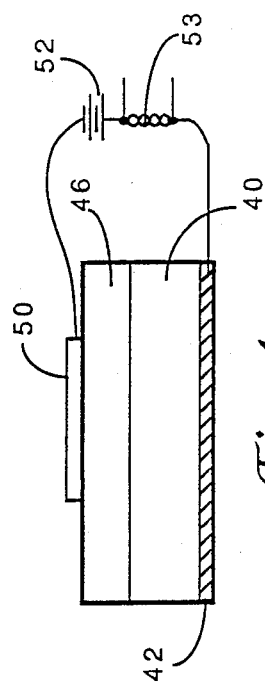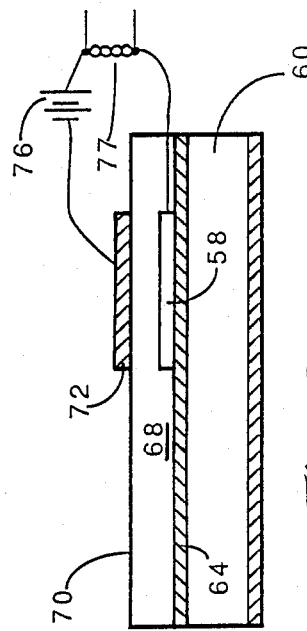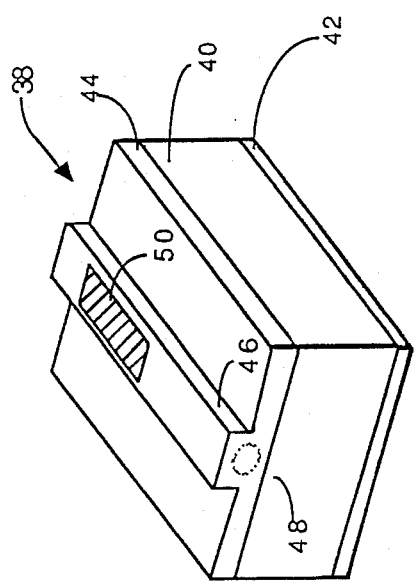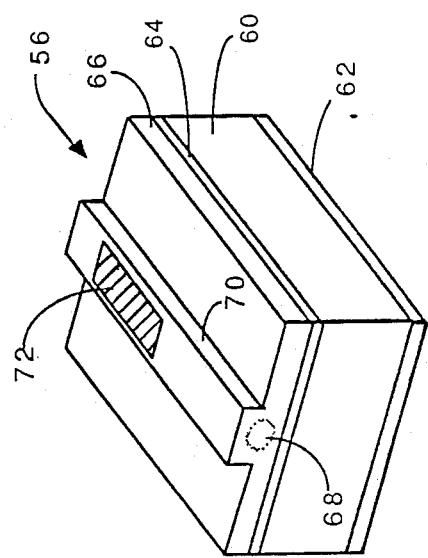

SILICON WAVEGUIDE WITH MONOLITHICALLY INTEGRATED SCHOTTKY BARRIER PHOTODETECTOR

STATEMENT OF GOVERNMENT INTEREST

The invention described herein may be manufactured and used by or for the Government for governmental purposes without the payment of any royalty thereon

BACKGROUND OF THE INVENTION

This invention relates generally to integrated optical circuits and the components making up such circuits. More particularly this invention relates to a type of integrated photodetector for detecting infrared signals propagating in a silicon waveguide.

The recent development of low loss single mode optical fibers with low dispersion at the 1.3 and 1.6 micron wavelengths has focused attention on long wave integrated optical circuits and optical systems that couple to such fibers. Such optical circuits and systems are useful in telecommunication, data communication, optical signal processing, optical interconnection, optical sensing, and microwave antenna control application. Semiconductor guided wave circuits are of special interest because they can, in principle, provide electrooptic integration; that is, the monolithic integration of optical guided wave components with electronic circuits and electro-optical components on a single chip.

The fundamental building blocks of such guided wave circuits are the channel waveguides which are used to make various optical components including switches, modulators and interconnects. In all these components, it is essential to keep optical propagation losses at a minimum (less than 1db per cm) in order to allow multiple guided wave components to be cascaded on one wafer (such as a switching network) without incurring a significant loss penalty.

Waveguides suitable for use in an integrated optical circuit due to their high efficiency, small size and ease of fabrication are described in a related application entitled "Method of Fabricating Low Loss Crystalline Silicon Waveguides" (Joseph P. Lorenzo and Richard A. Soref,) Ser. No. 928,349 filed Nov. 10, 1986. The methods described therein provide the desired techniques for fabricating waveguides operative at 1.3 microns to 1.6 micron wavelengths which do not suffer from the complexity or expense of using binary, ternary or quatenary alloy compositions of various materials to fabricate waveguides.

In another related application, entitled "Electro-Optical Silicon Devices" (Joseph P. Lorenzo and Richard A. Soref) Ser. No. 036,822 filed Mar. 26, 1987 various silicon devices compatible with the above-mentioned waveguides have been described. Switching and light modulating devices can be suitably integrated, manufactured and networked with low loss silicon waveguides. In spite of the above, there remains the problem of integrating passive and active low loss optical circuitry with a viable photodetector.

Schottky barrier infrared photodetectors are well known in the art. Examples of prior art Schottky barrier infrared photodetectors can be found in U.S. Pat. No. 4,531,055 to Shepperd Jr. et al and in U.S. Pat. No. 4,533,933 to Pellegrini et al. Yet a further example of a prior art Schottky barrier photodetectors is found in U.S. Pat. No. 4,467,340 to Rode et al. In all of the above referenced patents, the Schottky barrier photodetectors are positioned at a focal plane for the sensing of an external light source.

Use of these prior art detectors in an integrated optical circuit has several disadvantages. All of the above referenced photodetectors require the normal incidence of light on the sensing element and it is hard to imagine how to successfully integrate such elements into an integrated optical circuit where light signals are maintained within solid state optical channels. Going from a guided to an unguided condition is undesirable in solid state waveguide systems. Overcoming these problems increases manufacturing expenses and decreases reliability.

It therefore appears that the prior art Schottky barrier photodetectors are fundamentally inefficient for use with newly devised optical waveguide structures. Further, these photodetectors are also difficult to incorporate physically into an integrated optical circuit due to their size and material requirements.

A need therefore exists for a photodetector suitable for integration with integrated optical circuits and solid state waveguide channels. Further, a need exists for a photodetector that can be constructed of materials compatible with common optical structures made of common materials such as silicon. It would also be advantageous if such a detector offered the flexibility of a variety of possible structures to allow easy incorporation of detectors into a variety of integrated optical circuits.

SUMMARY OF THE INVENTION

The present invention overcomes the problems encountered in the past and as set forth in detail hereinabove by providing a room temperature photodetector which can be monolithically integrated onto a silicon waveguide.

In the preferred embodiments of the invention the photodetector comprises a silicon substrate upon which is deposited/grown a crystalline silicon layer that comprises a waveguide for transmission of optical signals. A Schottky barrier contact is attached to the crystalline silicon layer at the waveguide and an Ohmic contact is electrically connected to the waveguide for biasing the Schottky barrier contact in order to detect optical signals passing through the waveguide.

In the preferred embodiment of the invention a dielectric layer is interposed between the substrate and the crystalline silicon layer which forms the waveguide in order to confine light signals and reduce signal loss. In one embodiment it is preferred that the Schottky barrier contact forms a surface contact at the top surface of the silicon waveguide and that the Ohmic contact forms a surface contact which surrounds the Schottky barrier contact adjacent to the waveguide.

In another preferred embodiment the Schottky barrier contact is positioned on the dielectric layer that is deposited on top of the substrate. The crystalline silicon layer is then grown/deposited on top of the Schottky contact and formed into a waveguide that covers the Schottky barrier contact. In this embodiment the Ohmic contact is formed at the top of the waveguide.

In some of the preferred embodiments, the substrate comprises n+doped semiconductor material and the waveguide layer comprises n doped material. It is, however, also possible to construct these photodetectors with p doped material.

In yet another preferred embodiment of the invention, the photodetector comprises two Schottky barrier contacts bracketing a waveguide formed in the top crystalline silicon layer.

BRIEF DESCRIPTION OF THE DRAWINGS

The foregoing objects and other advantages of the invention will be apparent from the following more particular description of the preferred embodiments of the invention, as illustrated in the accompanying drawings, in which like reference characters refer to the same parts throughout the different views. The drawings are not necessarily to scale, emphasis instead being placed upon illustrating the principles of the invention.

FIG. 3 is a perspective view of a second embodiment of the invention;

FIG. 4 is a lengthwise section of the embodiment of FIG. 3 and schematically presents the electrical connections between the active elements;

FIG. 5 shows yet another embodiment of the invention incorporating a buried Schottky barrier contact;

FIG. 6 is a lengthwise sectional view of the embodiment of FIG. 5 and shows schematically the electrical connections between the elements;

DETAILED DESCRIPTION OF THE INVENTION

In the invention comprises a new type of integrated photodetector designed to detect 1.1 to 1.6 microns infrared signals propagating in a silicon waveguide. The detector is a room temperature device based upon silicon technology and is monolithically integrated with a silicon channel waveguide on a planar substrate.

Single mode silicon channel waveguides have been discussed previously in two related applications. Application Ser. No. 928,349 by Joseph P. Lorenzo and Richard A. Soref, entitled "Method of Fabricating Low Loss Crystalline Silicon Waveguides", filed Nov. 10, 1986 discloses the processes for manufacturing single mode silicon channel waveguides. Application Ser. No. 036,822 by Joseph P. Lorenzo and Richard A. Soref filed Mar. 16, 1986 and entitled "Electro Optical Silicon Devices" discloses various active devices constructed with single mode silicon channel waveguides. A key feature in any electrooptic circuit incorporating optical devices and waveguides is an integrated detector for converting optical signals to electrical signals to allow interconnection of optical signals with conventional electronic devices.

The detecting portion of the integrated structure in all of the embodiments discussed below is a room temperature photodetector that makes use of a metallic silicide such as paladium or platinum silicide to form a Schottky barrier contact. This Schottky barrier contact is similar to other Schottky barrier contacts which are known in the art and are discussed above in relation to the prior art devices. The detecting mechanism of this device, however, is unique since it relies upon interactions between the metallic silicide Schottky barrier and the "tail" region of the propagating optical mode. This allows for integration of the Schottky barrier contact directly onto the solid state silicon waveguide. Light therefore impinges at grazing incidence, parallel to the Schottky plane rather than at-right angles in free space as it would in a conventional detector.

These Schottky devices can be operated in the avalanche mode as well as the typical reverse-bias mode. It is preferred, however, that these detectors operate in the avalanche mode to provide low noise amplification. Many contact geometries are possible, some of which are discussed below.

Figure 1:
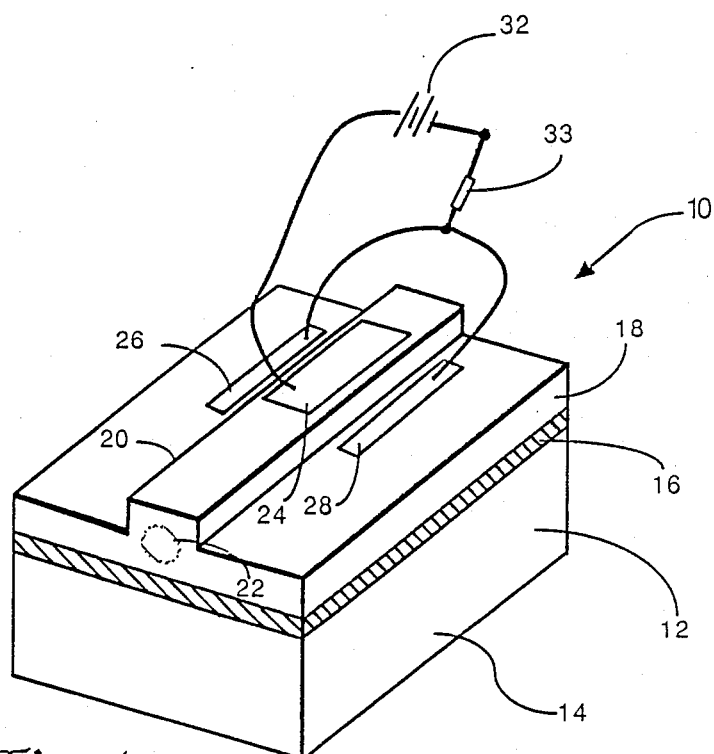
FIG. 1 is a perspective view of a Schottky barrier photodetector monolithically incorporated on a silicon waveguide which embodies the principles of this invention.

FIG. 1 shows an embodiment of this device in which a Schottky barrier contact is used to form a photodetector 10 on a portion of a waveguide chip 12. The waveguide chip comprises a crystalline substrate 14 onto which is deposited/grown a dielectric layer 16 of silicon dioxide, silicon nitride or other suitable dielectric material. A crystalline silicon layer 18 can then be deposited/grown upon the dielectric 16. This silicon layer 18 is etched to form a waveguide 20 having a light propagating area 22. Typically the waveguide rib is about 0.5 microns high, atop a 1.5 micron thick silicon slab. Rib width is typically about 2 microns.

Positioned directly on top of the waveguide 20 is a Schottky barrier contact 24. Ohmic contacts 26 and 28 are positioned on each side of the waveguide 20 on the upper crystalline silicon layer 18.

Figure 2:
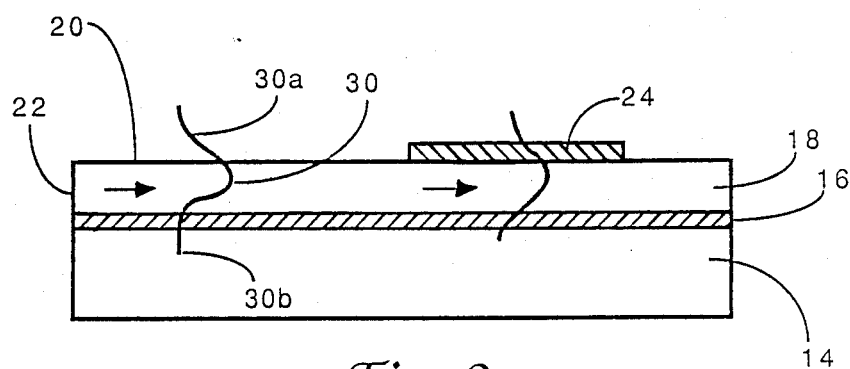
FIG. 2 is a cross sectional schematic of the photodetector of FIG. 1.

FIG. 2 shows schematically the optical mode distribution 30 of light travelling through the light propagation area 22. Although, the optical mode 30 propagates most strongly in area 22, the light "tails" (30a and 30b) both out of the waveguide and into the dielectric layer 16. Depending on the thickness of the dielectric layer 16 some light, a very small portion, may even tail into the substrate 14. As the light passes the Schottky barrier contact 24 the light tailing above the waveguide is absorbed by the Schottky barrier.

The Schottky barrier contact 24 is connected to a biasing electric source 32 (FIG. 1). This electric source is also connected to both Ohmic contacts 26 and 28 in order to properly bias the Schottky contact. The Ohmic contact or contacts serve as an electrical return path for a reverse bias voltage of applied to the Schottky barrier. After sufficient signal is absorbed by the Schottky barrier contact a measureable current flow is created between the waveguide 20 and the Schottky barrier contact 24. This current flow can be detected across resistor 33.

Typically, to sense light in the 1.1 to 1.6 micron wavelength range an n doped waveguide is used adjacent to the Schottky barrier contact 24. In the vicinity of the Ohmic contacts 26 and 28, n+doped material may be implanted or diffused into the top silicon layer waveguide in order to increase local conductivity. If longer wavelengths of light are to be detected, p type doping is advisable in order to adjust the barrier for efficient detection at the desired wavelength.

The Schottky barrier contact along its length 24 preferably absorbs as much as to 70% of the light. The Schottky barrier contact captures enough of the signal to essentially arrest the signal at the detector and very little optical signal continues in the waveguide past the detector. Distributed interaction occurs along the length of the barrier between the semiconductor material of the waveguide and the silicide film of the contact to provide a high rate of optical absorption. This high absorption of the optical signal is necessary because of the relatively low quantum efficiency of this type of detector. The quantum efficiency of Schottky barrier contacts can vary between 1% and 10% depending on parameters such as optical wavelength, barrier metal, and substrate type as well as geometric design. In order to produce a useable electronic signal from the Schottky barrier contact it is often necessary to operate these contacts in the avalanche mode which provides low noise amplification. The signal from the Schottky barrier contact is then amplified and used in an electronic circuit.

Because of the waveguide loading associated with metal silicide, the optical field is strong at the metal interface, which increases detection efficiency. The interaction is described mathematically by an overlap integral between the collection tail and the optical mode tail. In practice, a strong absorption of light occurs via this process and results in a reasonable quantum efficiency.

FIG. 3 shows another embodiment of a waveguide with a monolithically integrated Schottky barrier photodetector. The combination detector and waveguide 38 comprises a crystalline substrate 40 with a contact base 42. A crystalline silicon waveguide layer 44 is deposited/grown on top of the silicon substrate 40. The substrate layer is preferably n+type material, (i.e. doping of about $10^{18}$ or $10^{19}$ cm$^{-3}$) whereas the silicon waveguide layer 44 is preferably n-type material. This is done in order to substantially confine the light propagating light laterally in the etched waveguide 46. The waveguide 46 has a light propagating area 48 and is equipped with a Schottky barrier contact 50.

FIG. 4 is a cross sectional view of the device of FIG. 3 in which it is shown that the base 42 is used as an Ohmic contact and is connected through an electric source 52 to the Schottky barrier contact 50. The Schottky barrier contact 50 sits on the waveguide 46 of n-type material. The n+material of substrate 40 has relatively high conductivity and provides a good electrical connection between the Ohmic contact and the waveguide body. The embodiment of FIGS. 3 and 4 is particularly easy to manufacture and both the Ohmic and Schottky barrier contacts are easily made.

The photodetector 38 operates in the same manner as the photodetector 10 discussed in reference to FIG. 1 and 2. Specifically, the Schottky barrier contact is biased such that infrared light passing through waveguide 46 will be absorbed by the contact and produce a measurable current that can be manipulated for use in electronic devices. The current flow is detected across resistor 53.

If it is preferred to detect long wavelength light (5 to 6 micron range) then substrate 40 can be made from p+type material and waveguide 46 from p-type material in order to properly adjust the metal semiconductor Schottky barrier interface for efficient signal absorption.

FIGS. 5 and 6 show yet another embodiment of this invention. This embodiment of the invention comprises a photodetector 56 having a buried Schottky barrier contact 58 (FIG. 6). The waveguide chip of this device is similar to that discussed in FIG. 1 above. A substrate 60 having a base 62 is formed of crystalline silicon material upon which is placed a dielectric layer 64 of a suitable dielectric such as silicon dioxide. A waveguide layer 66 of crystalline silicon is then formed on top of the dielectric 64. The dielectric layer 64 defines the base of a light propagation area 68 which is formed in a waveguide 70. The waveguide 70 is etched from waveguide layer 66, the waveguide layer 66 is of insufficient height away from waveguide 70 to support signal propagation. On top of the waveguide 70 is an Ohmic contact 72.

Referring now to FIG. 6, it can be seen that the waveguide 70 light propagation area 68 is bracketed by the Ohmic contact 72 and the Schottky barrier contact 58. Light travelling through light propagation area 68 is absorbed by the Schottky barrier contact 58 as it passes between the Ohmic and Schottky barrier contacts. The contacts are connected to an electrical source 76 which biases the Schottky barrier contact for maximum signal detection. The Ohmic contact is a simple surface contact while the Schottky barrier device requires a circuit lead to provide access to the biasing voltage source 76. Standard mesa techniques can be used for this connection. In all other respects this device is similar to the devices disclosed above. Current flow is detected across resistor 77. If used for near infrared detection, the photodetector 56 would be made preferably of n type material.

Figure 8:
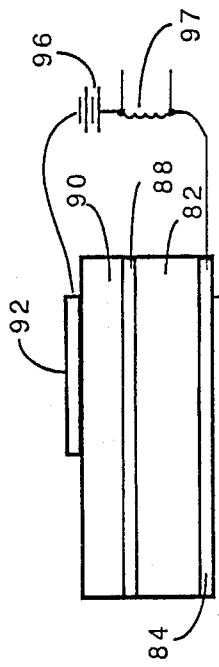
FIG. 8 is a cross sectional view of the device of FIG. 7 which includes a schematic representation of the electrical connections between the active elements.
Figure 7:
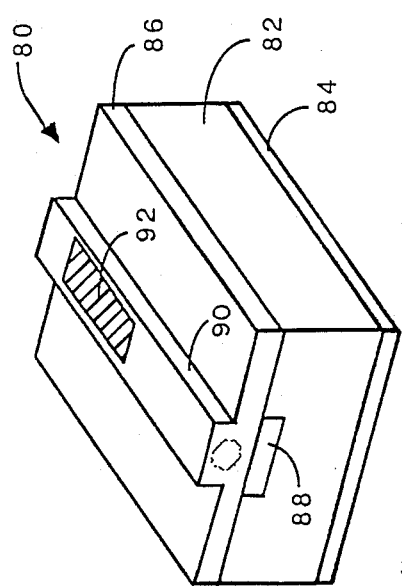
FIG. 7 shows an embodiment of the invention incorporating a dielectric stripe and a Schottky barrier contact.

FIG. 7 and 8 show another embodiment of this invention, which combines some of the advantages of the devices described in reference to FIGS. 1 and 3. In this embodiment, the combined photodetector and waveguide 80 comprise a substrate 82 having a contact base 84. A crystalline silicon waveguide layer 86 is positioned upon the substrate 82. The substrate 82 has an etched central area which forms a well for a dielectric stripe 88. This dielectric stripe is preferably made of silicon dioxide or other dielectric material that forms an insulating barrier to prevent light tailing from the waveguide 90 into the substrate 82. The waveguide layer 86 is of insufficient thickness to support light propagation except in the waveguide area 90. A Schottky barrier contact 92 is positioned upon the waveguide 90. FIG. 8 is a cross section view taken across the length of the waveguide that shows schematically the electrical connections between the elements. Since the dielectric layer 88 forms only a stripe directly beneath waveguide 90 the substrate 82 and the waveguide layer 86 are in electrical contact. Preferably the substrate is formed of n+doped material while the waveguide layer is preferably n doped material. This allows for easy placement of the Ohmic contact 94 at the base of the substrate.

The Schottky barrier contact 92 and the Ohmic contact 94 are connected to a power source 96 for biasing the Schottky barrier contact 92 and current is detected across resistor 97. Thus, the photodetector uses a localized dielectric layer 88 to enhance waveguide light transmission efficiency by preventing excessive tailing of guided light signals into the substrate while permitting electrical connection between the layers to facilitate electrical connections for biasing the Schottky barrier contact.

Figure 11:
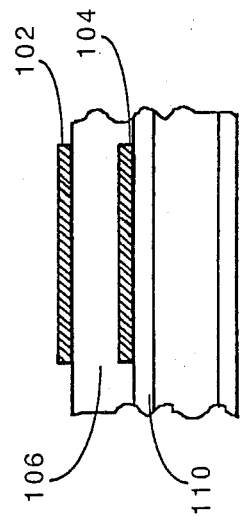
FIG. 11 is a partial lengthwise sectional view of the photodetector of FIG. 9.
Figure 10:
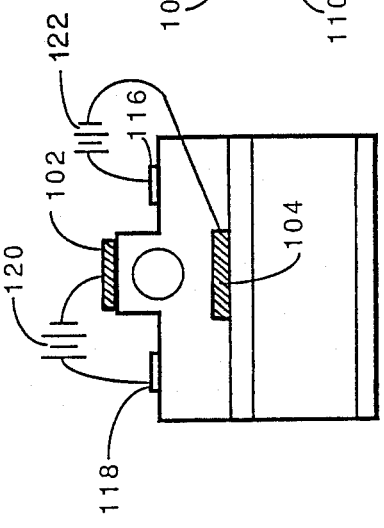
FIG. 10 is a transverse cross sectional view of the device of FIG. 9 and includes schematic representation of the electrical connections between the active elements.
Figure 9:
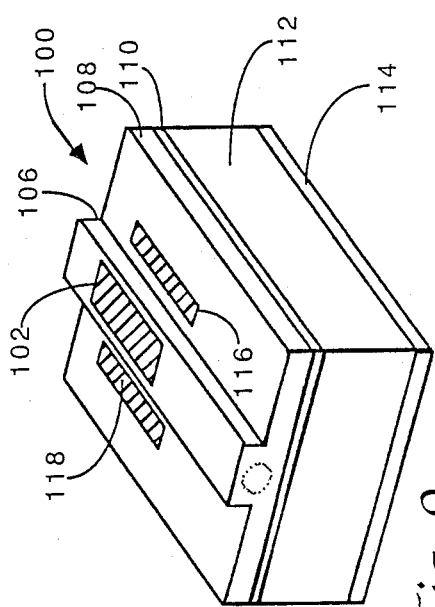
FIG. 9 is a perspective view of an embodiment of the photodetector which comprises dual Schottky barrier contacts.

FIGS. 9, 10 and 11 disclose a Schottky barrier infrared photodetecting device 100 that is particularly efficient in rapidly absorbing optic signals with Schottky barrier contacts. The device of FIGS. 9, 10 and 11 comprises two Schottky barrier contacts 102 and 104 (FIG. 10) which bracket a waveguide 106 formed in a top crystalline silicon layer 108. As before, the crystalline silicon layer is formed on a dielectric layer 110 which has been deposited/grown on a substrate 112 having a base portion 114. The use of dual Schottky barrier contacts may allow for shortening of the contact area due to a high rate of absorption of the optic signal.

Ohmic contact is made with the top layer 108 through the use of dual Ohmic surface contacts 116, 118. These Ohmic contacts may be provided with a local n+doped area implanted around their base in order to increase electrical conductivity. Typically, a local n+area can be implanted with phosporous or arsenic, or can be diffused in.

FIG. 11 shows how the two Schottky barrier contacts are used in the waveguide area 106 in order to rapidly absorb the passing optic signal and produce electrical output for interconnection with electronic devices. Each Schottky barrier contact is connected to a power source bias and an Ohmic contact. The electrical connection between the active elements of this device are shown schematically in FIG. 10. Schottky barrier contact 102 is connected through power source 120 to Ohmic contact 118 while Ohmic contact 116 is connected through a power source 122 to Schottky barrier contact 104. Standard mesa techniques can be used to make the electrical connection to barrier contact 104. The power sources again are used to bias the Schottky barrier contacts into an avalanche mode in order to optimize signal to noise ratio for maximum electrical signal. This use of avalanche mode biasing makes up for the relatively low quantum efficiency of Schottky barrier contacts.

In some instances, when a high efficiency Schottky barrier can be used it may be possible to detect the optical signal electronically and permit some optical signal to continue to propagate along the waveguide. But in the most general case, the optical signal would be almost completely absorbed by grazing contact with the Schottky barrier elements of the above discussed devices.

There are a number of novel features that are common to all of the above devices. These devices present monolithically integrated photodetectors on waveguide that are suitable for electrooptic integrated circuitry. All of these detectors can be used at room temperature to detect passing guided light signals. In contrast, prior art photodetectors are generally focal plane detectors which detect light in free space at normal incidence. Providing the free space required for a conventional photodetector is quite difficult on an integrated solid-state electro-optical chip. All of the photodetectors of this invention make use of longitudinal geometry to absorb the infrared signal at grazing incidence on the metal semiconductor interface formed where the Schottky barrier contact meets the crystalline silicon waveguide. The distributed interaction between the infrared optical signal of the waveguide and the silicide film of the Schottky barrier occurs along the length of the barrier and provides a high rate of optical absorption. Since this detector is integral with a silicon waveguide it is compatible with a large variety of optical waveguide structures and electronic devices. For a fuller understanding of this aspect of this invention, reference should be made to the related applications listed above.

In addition, as shown by the several structures described above, a variety of structures are available for integral Schottky barrier photodetectors. This increases the feasibility of incorporating this type of photodetector in a variety of integrated optical circuits. Finally, it should be noted that the detectors described herein are most efficient for the 1.3 and 1.6 micron wavelength region which is the most desirable for low loss single mode optical fibers with low dispersion. Similar detectors can be designed for longer wavelength detection.

While the invention has been described with reference to the preferred embodiments thereof it will be understood by those skilled in the art that various changes in substance and in form can be made therein without departing from the spirit and scope of the invention as detailed in the appended claims.

For example, although these devices have been described as silicon devices, other semiconductor waveguide materials can be used, such as indium phosphide or gallium arsenide.

We claim:

1. A photodetector comprising:
   a crystalline substrate;
   a first Schottky barrier contact positioned upon said crystalline substrate;
   a crystalline silicon layer deposited on said crystalline substrate and said first Schottky barrier contact wherein said crystalline silicon layer is formed into a waveguide for the transmission of optic signals;
   a second Schottky barrier contact position on top of said waveguide, said first and second Schottky barrier contacts for detecting light transmission through said waveguides; and
   an Ohmic contact electrically connected to said crystalline silicon layer.

2. The photodetector of claim 1 further comprising a dielectric layer interposed between said substrate and crystalline silicon layer in order to confine said waveguide and increase light transmission efficiency.

3. The photodetector of claim 1 wherein said photodetector is sensitive to light in the 1.1 to 1.6 micron wavelengths.

* * * * *